US012568616B2

(12) United States Patent
Tseng et al.

(10) Patent No.: US 12,568,616 B2
(45) Date of Patent: Mar. 3, 2026

(54) METHOD FOR FORMING MEMORY PATTERNS AND WIRE PATTERNS SIMULTANEOUSLY

(71) Applicant: Winbond Electronics Corp., Taichung City (TW)

(72) Inventors: Ling-Chun Tseng, Taichung City (TW); Tzu-Ming Ou Yang, Taichung City (TW); Pin-Han Chiu, Hsinchu City (TW)

(73) Assignee: WINBOND ELECTRONICS CORP., Taichung City (TW)

( * ) Notice: Subject to any disclaimer, the term of this patent is extended or adjusted under 35 U.S.C. 154(b) by 944 days.

(21) Appl. No.: 17/721,088

(22) Filed: Apr. 14, 2022

(65) Prior Publication Data

US 2023/0337417 A1    Oct. 19, 2023

(51) Int. Cl.
  *H01L 27/108*    (2006.01)
  *H10B 12/00*    (2023.01)

(52) U.S. Cl.
  CPC .......... *H10B 12/485* (2023.02); *H10B 12/09* (2023.02); *H10B 12/315* (2023.02); *H10B 12/50* (2023.02)

(58) Field of Classification Search
  CPC .............................. H10B 12/09; H10B 12/485
  See application file for complete search history.

(56) References Cited

U.S. PATENT DOCUMENTS

| | | | | |
|---|---|---|---|---|
| 2011/0159663 A1* | 6/2011 | Kang | ..................... | H10B 12/50 |
| | | | | 257/E21.573 |
| 2016/0365311 A1* | 12/2016 | Hung | ................ | H01L 21/32139 |
| 2017/0025284 A1* | 1/2017 | Kang | ..................... | H10D 89/10 |
| 2018/0247943 A1 | 8/2018 | Feng et al. | | |
| 2019/0019806 A1 | 1/2019 | Kim | | |
| 2019/0139767 A1* | 5/2019 | Shih | .................... | H01L 21/0335 |
| 2019/0139964 A1* | 5/2019 | Varghese | ............... | H10B 12/36 |
| 2020/0043733 A1* | 2/2020 | Chang | ................. | H01L 21/0337 |
| 2020/0135547 A1 | 4/2020 | Huang | | |
| 2021/0272962 A1 | 9/2021 | Feng et al. | | |

(Continued)

FOREIGN PATENT DOCUMENTS

| | | |
|---|---|---|
| TW | 201438057 A | 10/2014 |
| TW | 201528429 A | 7/2015 |
| TW | 201822332 A | 6/2018 |

(Continued)

*Primary Examiner* — Peter Bradford
(74) *Attorney, Agent, or Firm* — MUNCY, GEISSLER, OLDS & LOWE, P.C.

(57) ABSTRACT

A method for forming a semiconductor memory structure includes the following steps. A first patterned hard mask layer is formed over a conductive material. The first patterned hard mask layer includes first strip patterns and a mesa pattern. The mesa pattern is connected with the first strip patterns. A second patterned hard mask layer is formed over the first patterned hard mask layer. The second patterned hard mask layer includes second strip patterns overlapping the first strip patterns and first wire patterns overlapping the mesa pattern. The first patterned hard mask layer is etched using the second patterned hard mask layer. The remaining portions of the first strip patterns form pad patterns. The remaining portions of the mesa pattern form second wire patterns. The pad patterns and the second wire patterns are transferred into the conductive material.

20 Claims, 9 Drawing Sheets

(56) References Cited

U.S. PATENT DOCUMENTS

2021/0366719 A1* 11/2021 Zhou .................. H01L 21/0337
2023/0335407 A1* 10/2023 Wu .................... H10D 84/0151

FOREIGN PATENT DOCUMENTS

TW      201923825 A      6/2019
TW      202010079 A      3/2020
TW       I798920 B   *  4/2023

* cited by examiner

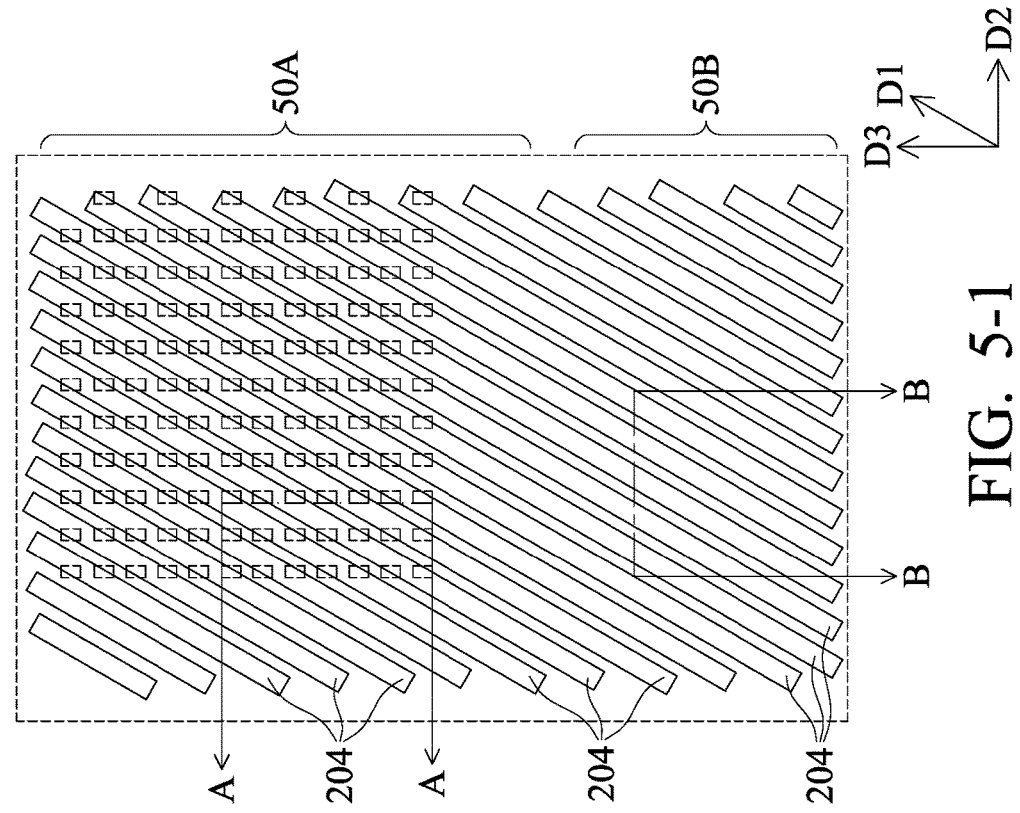
FIG. 5-1
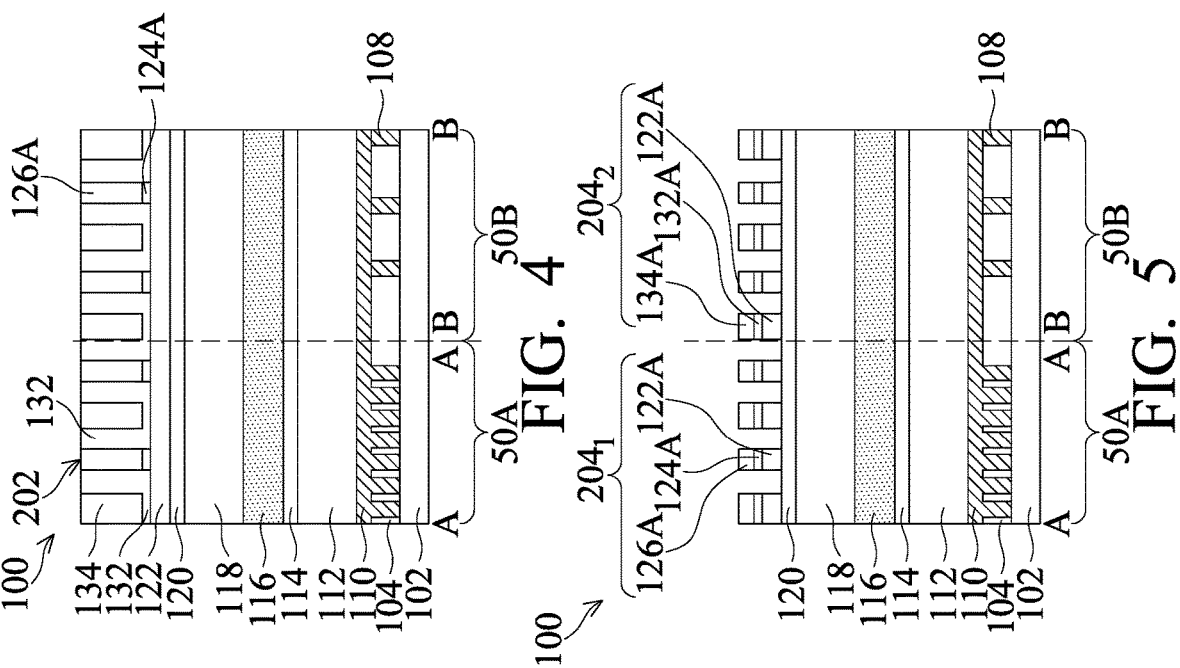
FIG. 4
FIG. 5

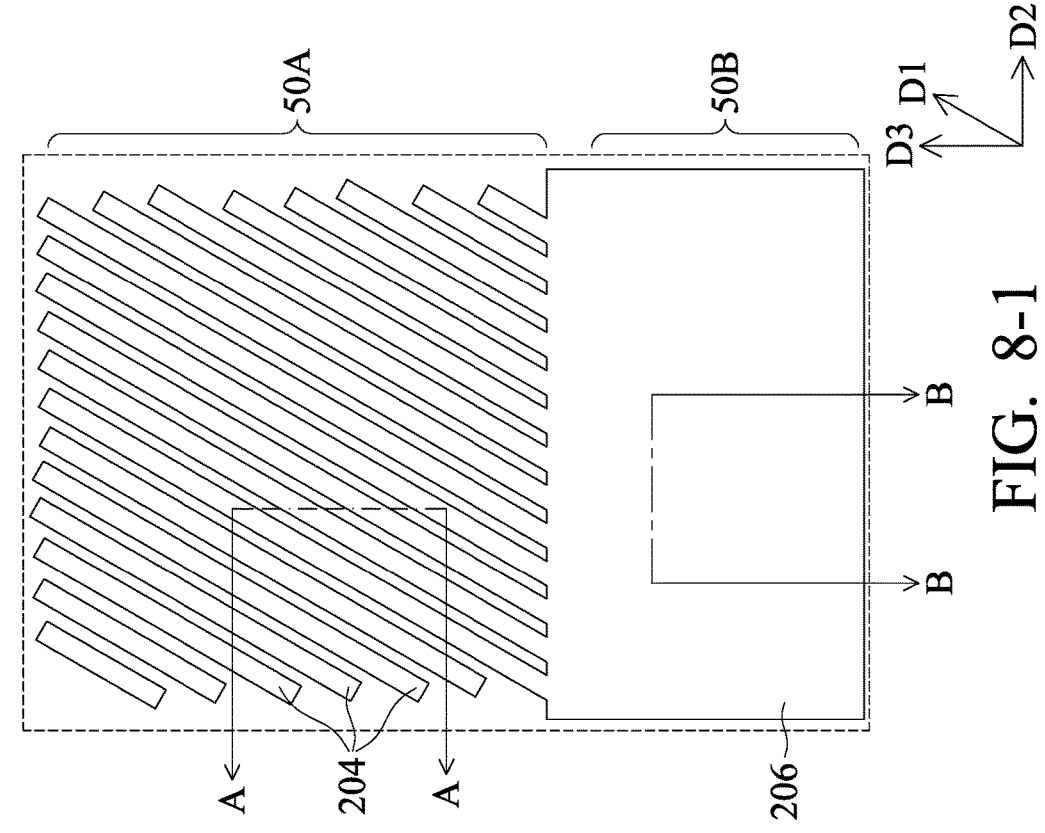
FIG. 8-1
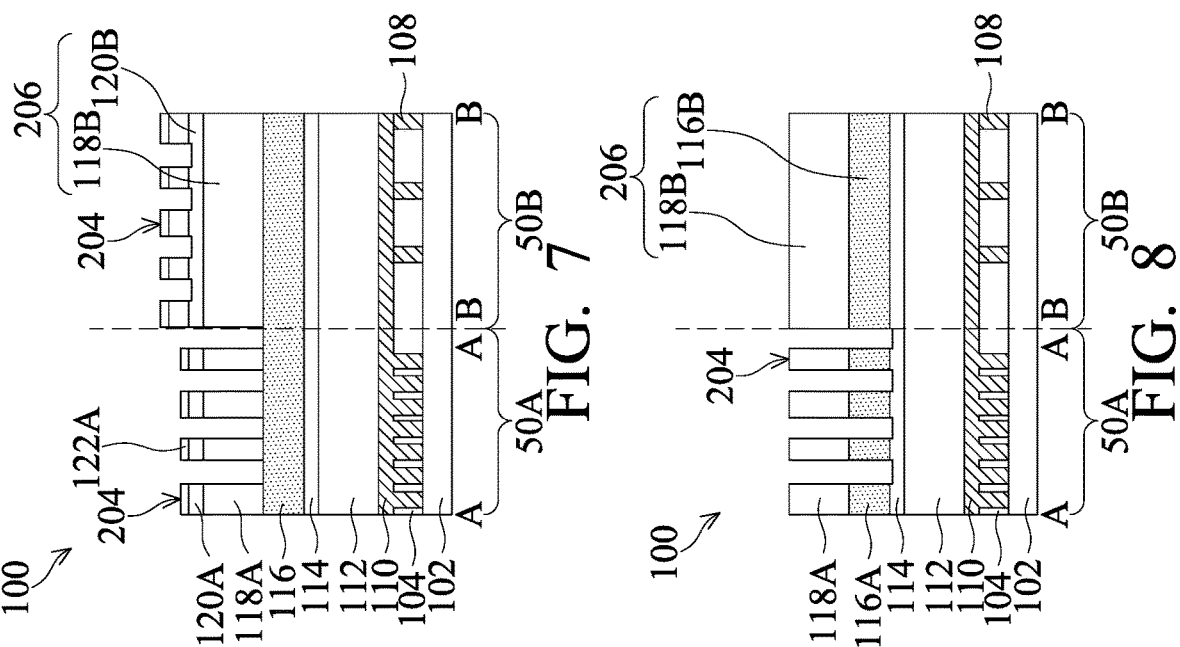
FIG. 7
FIG. 8

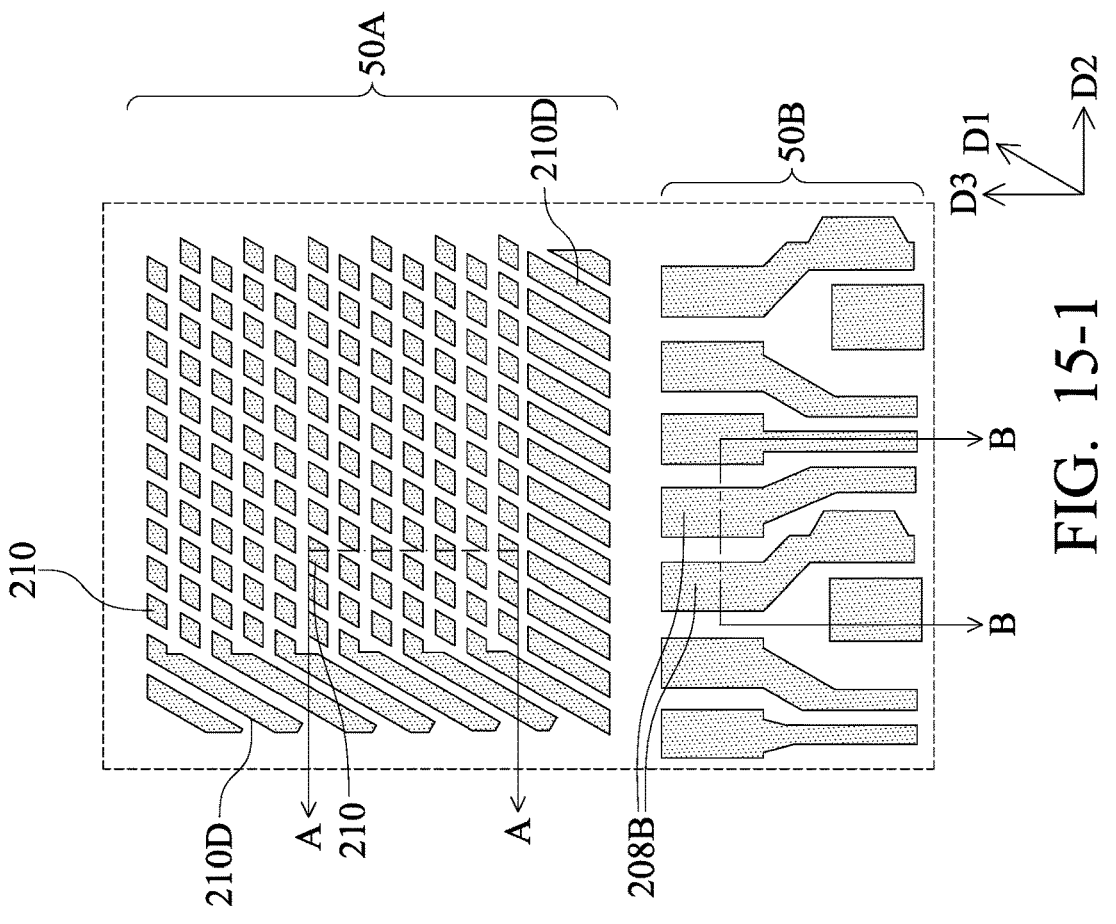
FIG. 15-1
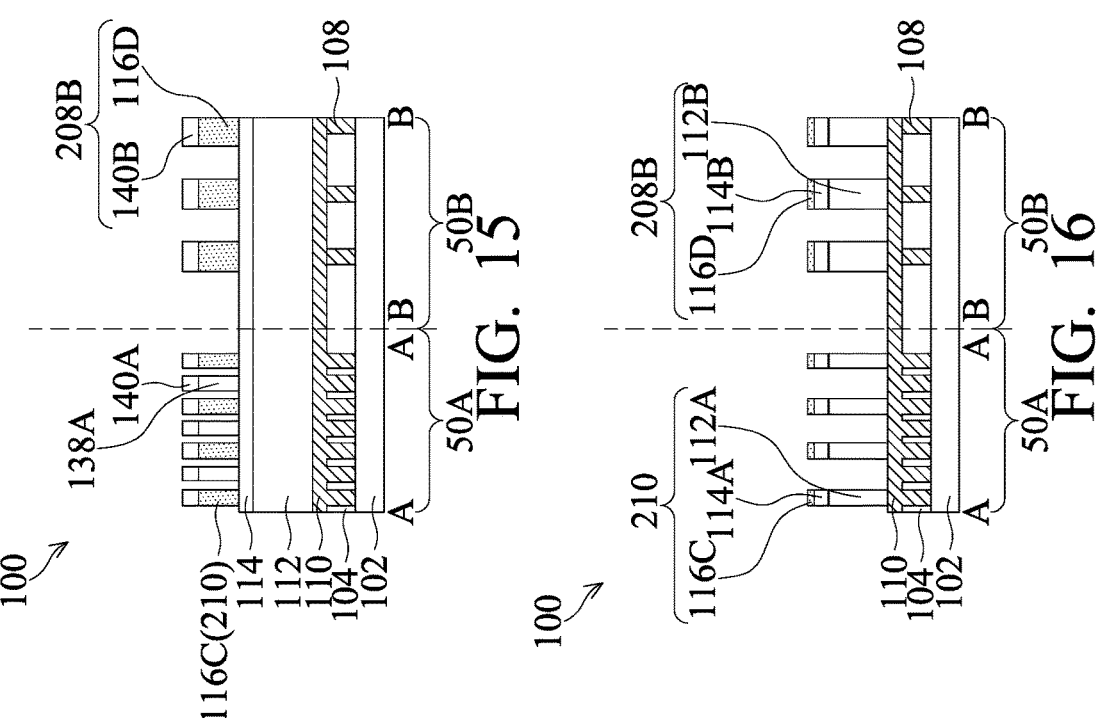
FIG. 15
FIG. 16

METHOD FOR FORMING MEMORY PATTERNS AND WIRE PATTERNS SIMULTANEOUSLY

BACKGROUND

Field of the Disclosure

The present disclosure relates to a method for forming a semiconductor memory structure, and in particular, it relates to Dynamic Random Access Memory.

Description of the Related Art

In order to increase DRAM density and improve its performance, existing technologies for fabricating DRAM devices continue to focus on scaling down the DRAM size.

SUMMARY

The method of forming a semiconductor memory structure includes forming a conductive material over a dielectric structure, and forming a first patterned hard mask layer over the conductive material. The first patterned hard mask layer includes first strip patterns and a mesa pattern connected to the first strip patterns. The method also includes forming a second patterned hard mask layer over the first patterned hard mask layer. The second patterned hard mask layer includes second strip patterns overlapping the first strip patterns and first wire patterns overlapping the mesa pattern. The method also includes etching the first patterned hard mask layer using the second patterned hard mask layer. Remaining portions of the first strip patterns form pad patterns, and remaining portions of the mesa pattern form second wire patterns. The method also includes transferring the pad patterns and the second wire patterns into the conductive material.

The method of forming a semiconductor memory structure includes forming a first hard mask layer over a semiconductor substrate. The semiconductor substrate includes a memory cell array region and a periphery circuitry region. The method also includes forming first strip patterns over the first hard mask layer. The first strip patterns continuously extend in the memory cell array region and the periphery circuitry region. The method also includes forming a photoresist pattern over the first strip patterns to cover the periphery circuitry region while exposing the memory cell array region, etching the first hard mask layer using the photoresist pattern and the first strip patterns to form second strip patterns in the memory cell array region and a mesa pattern in the periphery circuitry region, and patterning the second strip patterns and the mesa pattern of the first hard mask layer to form pad patterns in the memory cell array region and wire patterns in the periphery circuitry region respectively.

BRIEF DESCRIPTION OF THE DRAWINGS

In accordance with some embodiments of the present disclosure, it can be further understood by reading the subsequent detailed description and examples with references made to the accompanying drawings, wherein:

FIGS. 1-17 illustrate cross-sectional views of forming a semiconductor memory structure at various stages, in accordance with some embodiments of the present disclosure.

FIGS. 5-1, 6-1, 8-1, 10-1, 12-1, 13-1, 15-1 and 17-1 illustrate plan views of the semiconductor memory structure, in accordance with some embodiments of the present disclosure.

DETAILED DESCRIPTION

Figures 1, 2, 3:
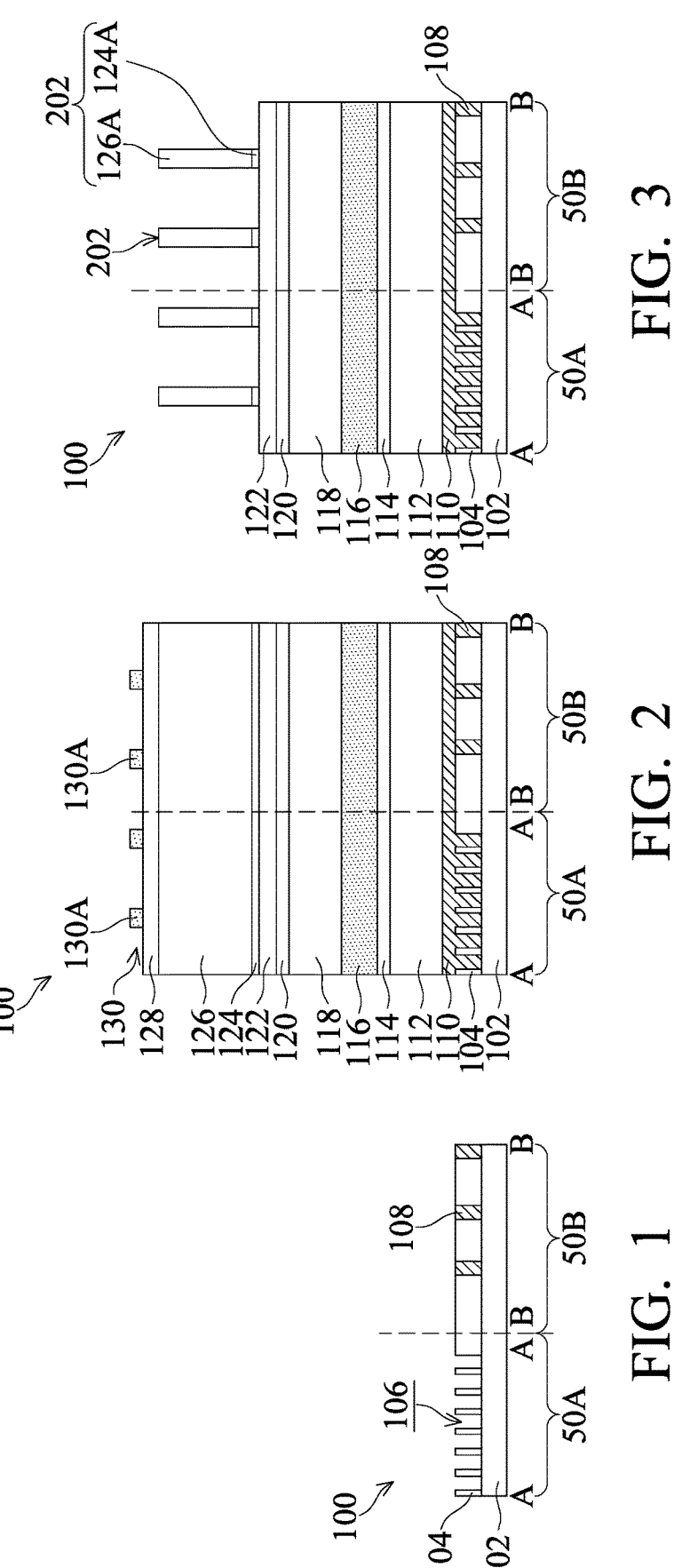
Figures 1, 17:
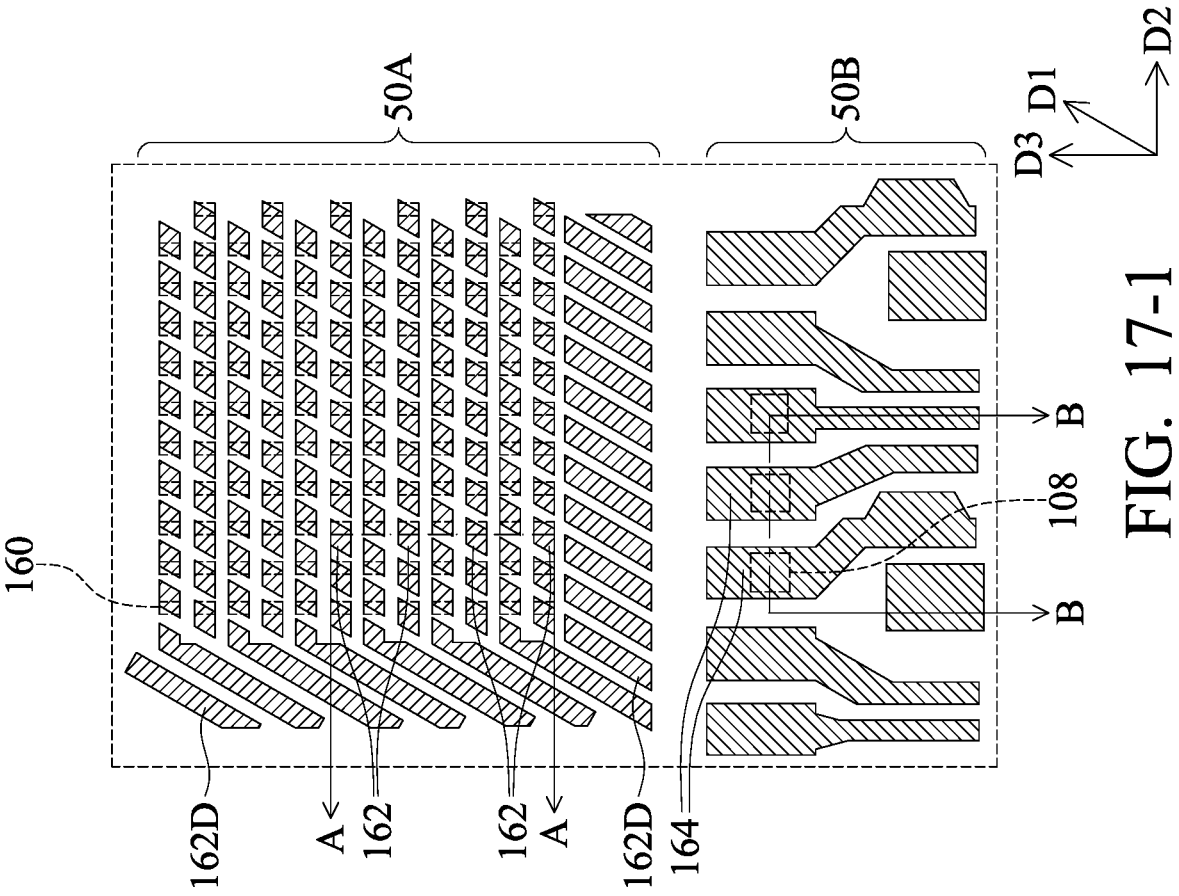
Figure 17:
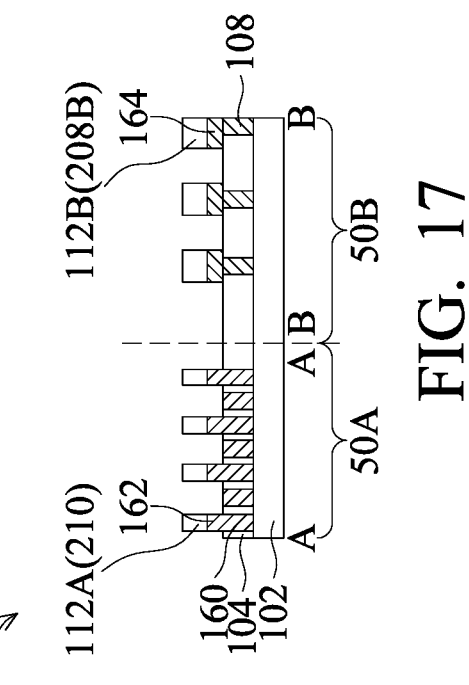

Referring to FIGS. 17 and 17-1, a semiconductor structure 100 including a substrate 102 and a dielectric structure 104 over the substrate 102 is provided. The substrate 102 may be defined as various device regions, e.g., a memory cell array region 50A, a peripheral circuitry region 50B, and/or another applicable region. Left parts of the FIGS. 1-17 illustrate the memory cell array region 50A which corresponds to Cross section A-A in the plan views. Right parts of the FIGS. 1-17 illustrate the peripheral circuitry region 50B which corresponds to Cross section B-B in the plan views. The peripheral circuitry region 50B is disposed adjacent to the memory cell array region 50A. Memory cells (e.g., DRAMs) are formed in the memory cell array region 50A and are operable as data storage. Peripheral circuitry devices are formed in the peripheral circuitry region 50B and are operable to access and/or control (e.g., perform read/write/erase operation) the memory cells in the memory cell array region 50A, in accordance with some embodiments.

In some embodiments, the substrate 102 may be or includes a semiconductor substrate. The semiconductor substrate may be an elemental semiconductor substrate or a compound semiconductor substrate.

In the memory cell array region 50A of the substrate 102, the memory cells may include gate structures (e.g., serving as word lines) embedded in the semiconductor substrate, and bit lines disposed over the semiconductor substrate. Word lines extend through active regions of the substrate 102 and combine with the source/drain regions in the active regions to form embedded transistors. The bit lines may be electrically connected to some source/drain regions in the active regions. Contact plugs 160 are disposed in the dielectric structure 104 and are electrically connected to some other source/drain regions in the active regions. Conductive pads 162 (or may be referred to as landing pads) are disposed over the dielectric structure 104 and disposed correspondingly over the contact plugs 160. In addition, the dummy conductive pads 162D are disposed at the edge of the memory cell array region 50A.

In the peripheral circuitry region 50B of the substrate 102, the periphery circuitry devices may include planar transistors and/or multi-gate transistors, which may include gate structures formed over the semiconductor substrate. Contact plugs 108 are disposed in the dielectric structure 104, and wires 164 are disclosed over the dielectric structure 104. The wires 164 are electrically connected to the gate structures and/or source/drain regions of the periphery circuitry devices through the contact plugs 108.

The conductive pads 162 in the memory cell array region 50A and the wires 164 in the peripheral circuitry region 50B are a portion of an interconnect structure and may be the metallic patterns located at the same level (e.g., M1 layer). In some embodiments of the present disclosure, the conductive pads 162 and the wire 164 are formed at the same time, and formed by transferring pad patterns 210 and wire patterns 208B into a conductive material using patterned hard mask layers 112A and 112B. The method of forming the conductive pads 162 in the memory cell array region 50A and the wires 164 in the peripheral circuitry region 50B are described in detail below.

Referring to FIG. 1, a dielectric structure 104 is formed over the substrate 102. The dielectric structure 104 may include one or more dielectric materials such as silicon oxide (SiO), silicon nitride (SiN), silicon oxynitride (SiON), a multilayer thereof, and/or a combination thereof. Openings 106 are formed in the dielectric structure 104 in the memory cell array region 50A by patterning processes (e.g., including photolithography processes and etching processes).

Referring to FIG. 2, one or more conductive material(s) 110 is formed over the dielectric structure 104 to overfill the openings 106. The portion of the conductive material 110 formed in the openings 106 may serve as the contact plug 160 shown in FIG. 17. The conductive material 110 may include polysilicon, metal silicide (such as cobalt silicide (CoSi), nickel silicide (NiSi), titanium silicide (TiSi) or tungsten silicide (WSi)), metal nitride (such as titanium nitride (TiN) or tantalum nitride (TaN)), metal material (such as tungsten (W), aluminum (Al), copper (Cu), cobalt (Co), or ruthenium (Ru)), a multilayer thereof, and/or a combination thereof.

Next, multiple hard mask layers 112-128 are sequentially formed over the conductive material 110. The hard mask layer 112 is made of carbon-rich material such as diamond-like carbon (DLC), High selectivity Transparency (HST), and/or spin-on coating carbon (SOC). The hard mask layer 114 is made of semiconductor material such as polysilicon. The hard mask layer 116 is made of silicon-rich dielectric material such as silicon-rich SiON (Si-SiON) and/or silicon-rich anti-reflective layer (Si-BARC). The hard mask layer 118 is made of carbon-rich material such as HST, DLC, and/or SOC. The hard mask layer 120 is a nitride layer such as silicon nitride. The hard mask layer 122 is an oxide layer such as silicon oxide. The hard mask layer 124 is made of semiconductor material such as polysilicon. The hard mask layer 126 is made of carbon-rich material such as SOC, DLC, and/or HST. The hard mask layer 128 is made of silicon-rich dielectric material such as silicon-rich anti-reflective layer (Si-BARC) and/or silicon-rich SiON (Si-SiON).

Next, a patterned photoresist layer 130 is formed over the hard mask layer 128 by a first photolithography process. The patterned photoresist layer 130 has strip patterns 130A that are substantially equally spaced apart from one another and are arranged in the memory cell array region 50A and the peripheral circuitry region 50B. In some embodiments, the first photolithography process uses an immersion coating technique.

Referring to FIG. 3, the semiconductor memory structure 100 is etched using the patterned photoresist layer 130 to sequentially etch away the portions of the hard mask layer 128, 126 and 124 uncovered by the patterned photoresist layer 130. The patterned photoresist layer 130 and the hard mask layer 128 may be entirely consumed in the etching process, or removed by an additional process such as an etching or ashing process. The etching process transfers the strip patterns 130A of the patterned photoresist layer 130 into the hard mask layers 126 and 124, thereby forming patterned hard mask layers 126A and 124A. The patterned hard mask layers 126A and 124A combine to form strip patterns 202, which may be also referred to as core patterns.

Referring to FIG. 4, a spacer layer 132 is formed along the sidewalls and the upper surface of the strip patterns 202 and the upper surface of the hard mask layer 122. Next, a fill layer 134 is formed over the spacer layer 132 and overfills the gaps between the strip patterns 202. Afterward, the portions of the spacer layer 132 and the fill layer 134 over the upper surfaces of the strip patterns 202 are removed to expose the patterned hard mask layer 126A. The spacer layer 132 is an oxide layer such as silicon oxide. The fill layer 134 is made of spin-on coating carbon.

Referring to FIGS. 5 and 5-1, an etching process is performed to remove the portions of the spacer layer 132 uncovered by the fill layer 134. The etching process further removes the portions of the hard mask layer 122 uncovered by the fill layer 134 until the hard mask layer 120 is exposed. Because the material (e.g., SiO) of the spacer layer 132 has a great etching selectivity with respect to the material (e.g., SOC) of the fill layer 134 and the hard mask layer 126, the etching process may remove the spacer layer 132 in a self-aligned manner without forming an additional mask. The etching process may also recess portions of the fill layer 134 and the patterned hard mask layer 126A.

After the etching process, the remaining portions of the hard mask layer 122 are denoted as 122A, the remaining portions of the spacer layer 132 are denoted as 132A, and the remaining portions of the fill layer 134 are denoted as 134A. The patterned hard mask layer 126A and 124A and underlying hard mask layer 122A combine to form strip patterns $204_1$. The fill layer 134A, the spacer layer 132A and the underlying hard mask layer 122A combine to form strip patterns $204_2$.

The strip patterns $204_1$ and $204_2$ are arranged in the memory cell array region 50A and the peripheral circuitry region 50B. As shown in FIG. 5-1, the strip patterns 204 (including $204_1$ and $204_2$) extend in a first direction D1 and are substantially equally spaced apart from one another. In some embodiments, the bit lines of the memory cells extend in a second direction D2, and the word lines of the memory cells extend in a third direction D3. The first direction D1 is not perpendicular to the second direction D2, and the second direction D2 is substantially perpendicular to the third direction D3.

Afterward, the fill layer 134A and the patterned hard mask layer 126A may be removed.

Figures 1, 6:
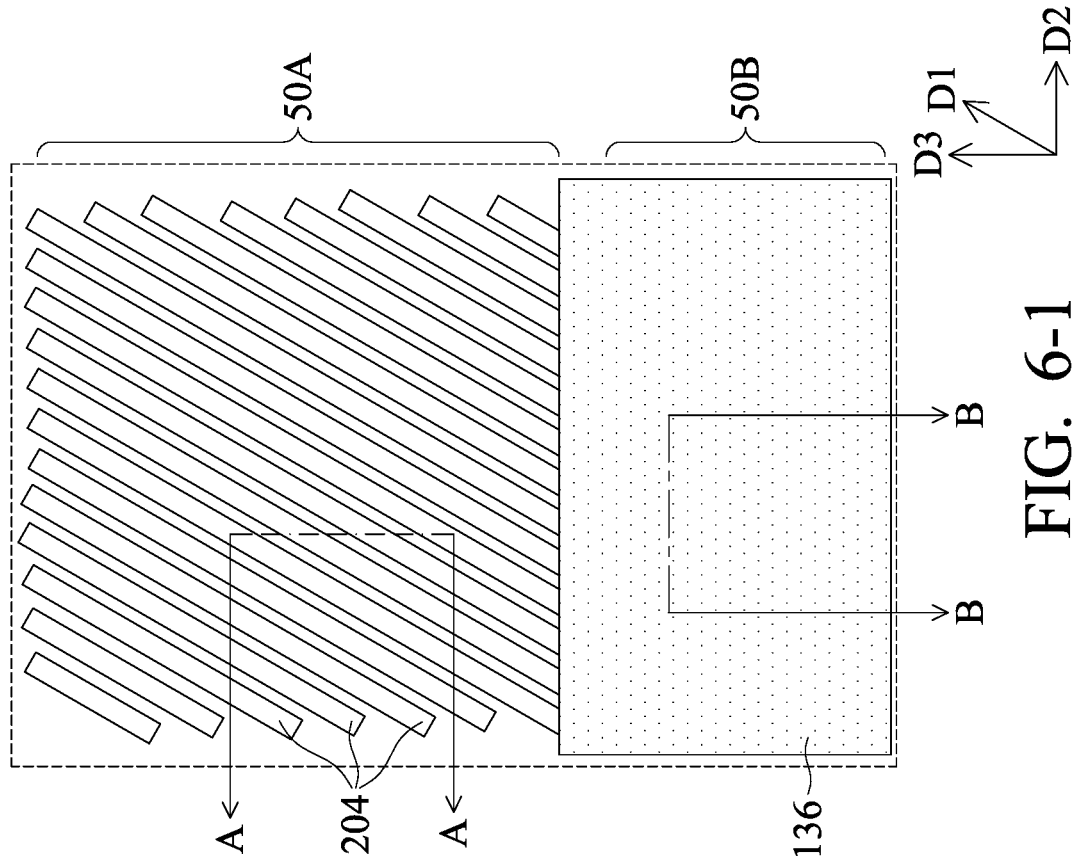
Figure 6:
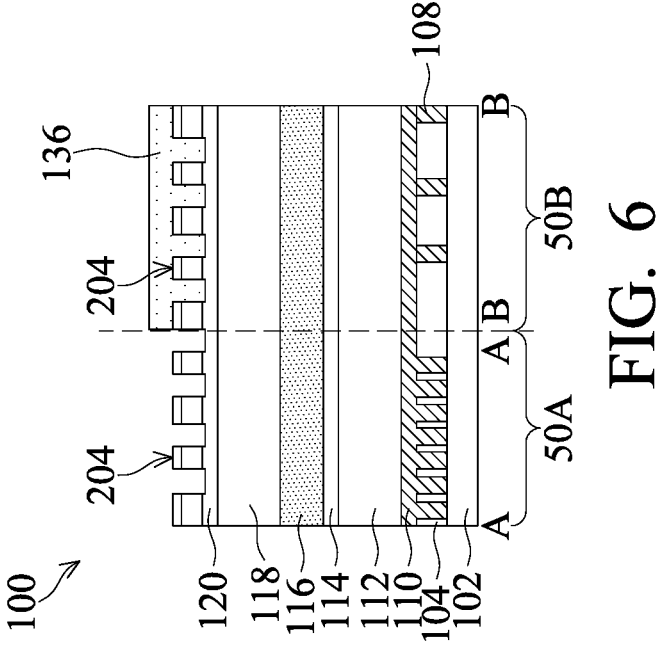

Referring to FIGS. 6 and 6-1, a photoresist pattern 136 is formed by a second photolithography process to cover the strip patterns 204 in the periphery circuitry region 50B while exposing the strip patterns 204 in the memory cell array region 50A. The photoresist pattern 136 is configured to prevent the strip patterns 204 in the periphery circuitry region 50B from being transferred into the underlying hard mask layers. In some embodiments, the second photolithography process uses an MUV (Middle ultra-violet) Mask technique which is cost-effective.

Referring to FIG. 7, an etching process is performed on the semiconductor memory structure 100 using the strip patterns 204 and the photoresist pattern 136 to sequentially etch away the portions of the hard mask layer 120 and 118 uncovered by the strip patterns 204 and the photoresist pattern 136. The spacer layer 132A and the patterned hard mask layer 124A in the memory cell array region 50A and the photoresist pattern 136 in the periphery circuitry region 50B may be entirely consumed in the etching process, or removed by an additional process. The etching process transfers the strip patterns 204 in the memory cell array region 50A into the hard mask layers 120 and 118 to form patterned hard mask layers 120A and 118A. The hard mask layers 120A and 118A have the strip patterns 204. In the periphery circuitry region 50B, the strip patterns 204 are not transferred into the hard mask layers 120 and 118 due to their being covered by the photoresist pattern 136. The photoresist pattern 136 in the periphery circuitry region 50B is transferred into the hard mask layers 120 and 118 to form patterned hard mask layers 120B and 118B. The patterned hard mask layers 120B and 118B combine to form a mesa pattern 206.

Referring to FIGS. 8 and 8-1, an etching process is performed on the semiconductor memory structure 100 to transfer the strip patterns 204 in the memory cell array region 50A into the hard mask layer 116 to form a patterned hard mask layer 116A, and to transfer the mesa pattern 206 in the periphery circuitry region 50B into the hard mask layer 116 to form a patterned hard mask layer 116B. The patterned hard mask layers 122A and 120A in the memory cell array region 50A may be entirely consumed in the etching process. Before being transferred into the patterned hard mask layer 118B, the strip patterns 204 in the periphery circuitry region 50B may be entirely consumed by controlling the etching process, or they may be removed by an additional process. As a result, the strip patterns 206 can be prevented from being transferred into the mesa pattern 206. The mesa pattern 206 is connected to some of the strip patterns 204. The width of the mesa pattern 206 in the second direction D2 is greater than that of a strip pattern 204 in the second direction D2.

Because of the loading effect of the etching process, in the etching process, the portion of the photoresist pattern 136 (FIG. 6) adjacent to the boundary between the memory cell array region 50A and the periphery circuitry region 50B may be consumed faster than the portion of the photoresist pattern 136 far away from the boundary. In the case where the photoresist pattern 136 has a lower etching selectivity with respect to the hard mask layers 120 and/or 118, some of the strip patterns 204 in the periphery circuitry region 50B adjacent to the boundary between regions 50A and 50B may be also transferred into the hard mask layer 120 and 118, when the strip patterns 204 in the memory cell array region 50A are transferred into the hard mask layer 120 and 118. Those strip patterns 204 in the periphery circuitry region 50B may also be transferred into the hard mask layer 116. As a result, the wire patterns 208B (FIG. 17) adjacent to the boundary between regions 50A and 50B may suffer from the issue of pattern failure (also referred to as array punchthrough).

In accordance with some embodiments of the present disclosure, because the hard mask layer 116 (in FIG. 6) is a flat layer that has not been patterned, the etching amount in the memory cell array region 50A may be enhanced by adjusting the parameters of the etching process (such as a greater bias RF power, higher flow rates of etchants, and/or another suitable parameter), while maintaining the photoresist pattern 136 lower etching amount. As a result, the etching selectivity between the photoresist pattern 136 and hard mask layers 120 and/or 118 may increase. This may substantially reduce the risk that those strip patterns 204 in the periphery circuitry region 50B that is adjacent to the boundary between regions 50A and 50B will be transferred into the hard mask layer 116. This can prevent pattern failure of the wire patterns 208B adjacent to the boundary between the memory cell array region 50A and the periphery circuitry region 50B. This can increase the manufacturing yield of the semiconductor memory device.

Afterward, the patterned hard mask layers 118A and 118B may be removed.

Figures 1, 9, 10:
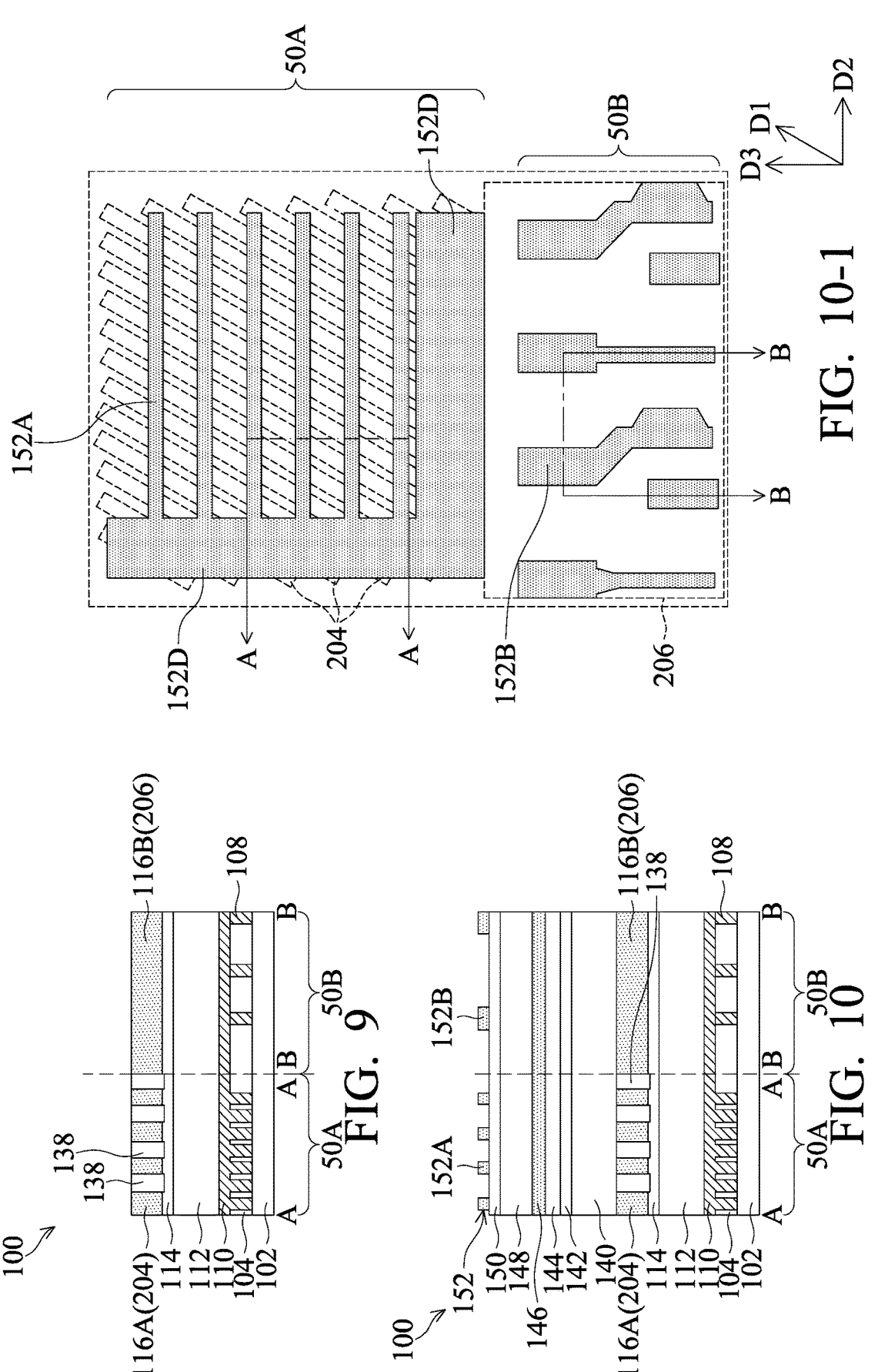

Referring to FIG. 9, a fill layer 138 is formed over the patterned hard mask layers 116A and 116B to overfill the gaps between the patterned hard mask layers 116A. Next, the portion of the fill layer 138 over the patterned hard mask layers 116A and 116B is removed to expose the patterned hard mask layers 116A and 116B. The fill layer 134 is an oxide layer such as SiO.

Referring to FIG. 10, multiple hard mask layers 140-150 are sequentially formed over the patterned hard mask layers 116A and 116B and the fill layer 138. The hard mask layer 140 is made of carbon-rich material such as HST, DLC, and/or SOC. The hard mask layer 142 is a nitride layer such as silicon nitride. The hard mask layer 144 is an oxide layer such as silicon oxide. The hard mask layer 146 is made of semiconductor material such as polysilicon. The hard mask layer 148 is made of carbon-rich material such as SOC, DLC, and/or HST. The hard mask layer 150 is made of silicon-rich dielectric material such as silicon-rich anti-reflective layer (Si-BARC) and/or silicon-rich SiON (Si-SiON).

Afterward, a patterned photoresist layer 152 is formed over the hard mask layer 150 by a third photolithography process, as shown in FIGS. 10 and 10-1. In the memory cell array region 50A, the patterned photoresist layer 152 has strip patterns 152A, and dummy patterns 152D at the edge of the memory cell array region 50A. In the periphery circuitry region 50B, the patterned photoresist layer 152 has wire patterns 152B. The strip patterns 152A extend in the second direction D2 and are substantially equally spaced apart from one another. In some embodiments, the third photolithography process uses an immersion coating technique.

Figures 1, 11, 12:
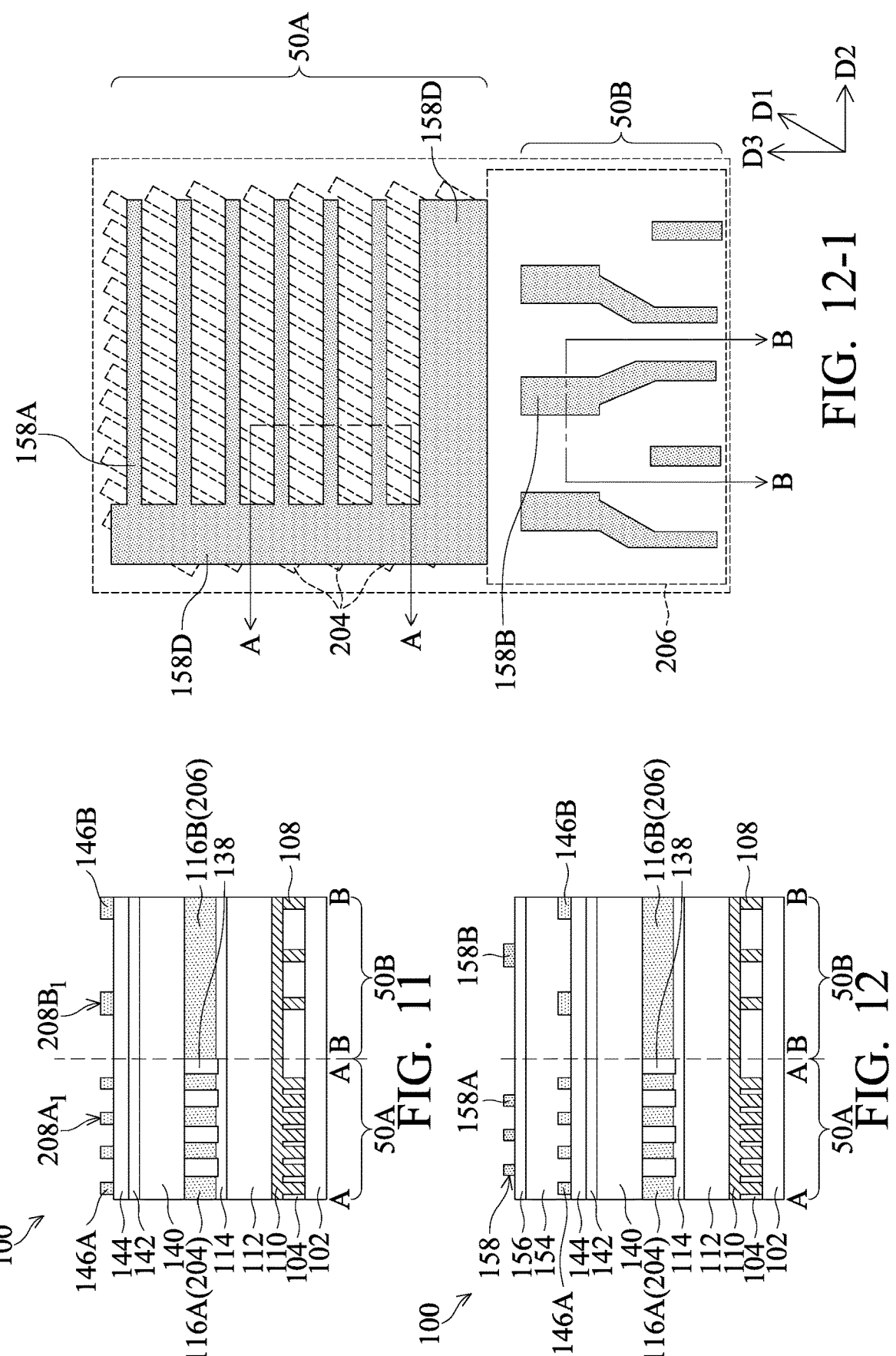

Referring to FIG. 11, an etching process is performed on the semiconductor memory structure 100 using the patterned photoresist layer 152 to sequentially etch away the portions of the hard mask layer 150, 148 and 146 uncovered by the patterned photoresist layer 152. The patterned photoresist layer 152 and the hard mask layer 150 and 148 may be entirely consumed in the etching process, or removed by an additional process. The etching process transfers the strip patterns 152A and the dummy patterns 152D of the patterned photoresist layer 152 into the hard mask layer 146 to form a patterned hard mask layer 146A. The patterned hard mask layer 146A has strip patterns 208Ai and dummy patterns (not shown). The wire patterns 152B are transferred into the hard mask layer 146 to form a patterned hard mask layer 146B. The patterned hard mask layer 146B has wire patterns $208B_1$.

Referring to FIG. 12, hard mask layers 154-156 are sequentially formed over the hard mask layer 144. The hard mask layer 154 is made of carbon-rich material such as SOC, DLC, and/or HST. The hard mask layer 156 is made of silicon-rich dielectric material such as silicon-rich anti-reflective layer (Si-BARC) and/or silicon-rich SiON (Si-SiON).

Afterward, a patterned photoresist layer 158 is formed over the hard mask layer 156 by a fourth photolithography process, as shown in FIGS. 12 and 12-1. In the memory cell array region 50A, the patterned photoresist layer 158 has strip patterns 158A, and dummy patterns 158D at the edge of the memory cell array region 50A. In the periphery circuitry region 50B, the patterned photoresist layer 158 has wire patterns 158B. The strip patterns 158A extend in the second direction D2 and are substantially equally spaced apart from one another. Furthermore, the strip patterns 158A are staggered with the strip patterns $208A_1$ of the patterned hard mask layer 146A, and the wire patterns 158B are staggered with wire patterns $208B_1$ of the patterned hard mask layer 146B. In some embodiments, the fourth photolithography process uses an immersion coating technique.

Figures 1, 13, 14:
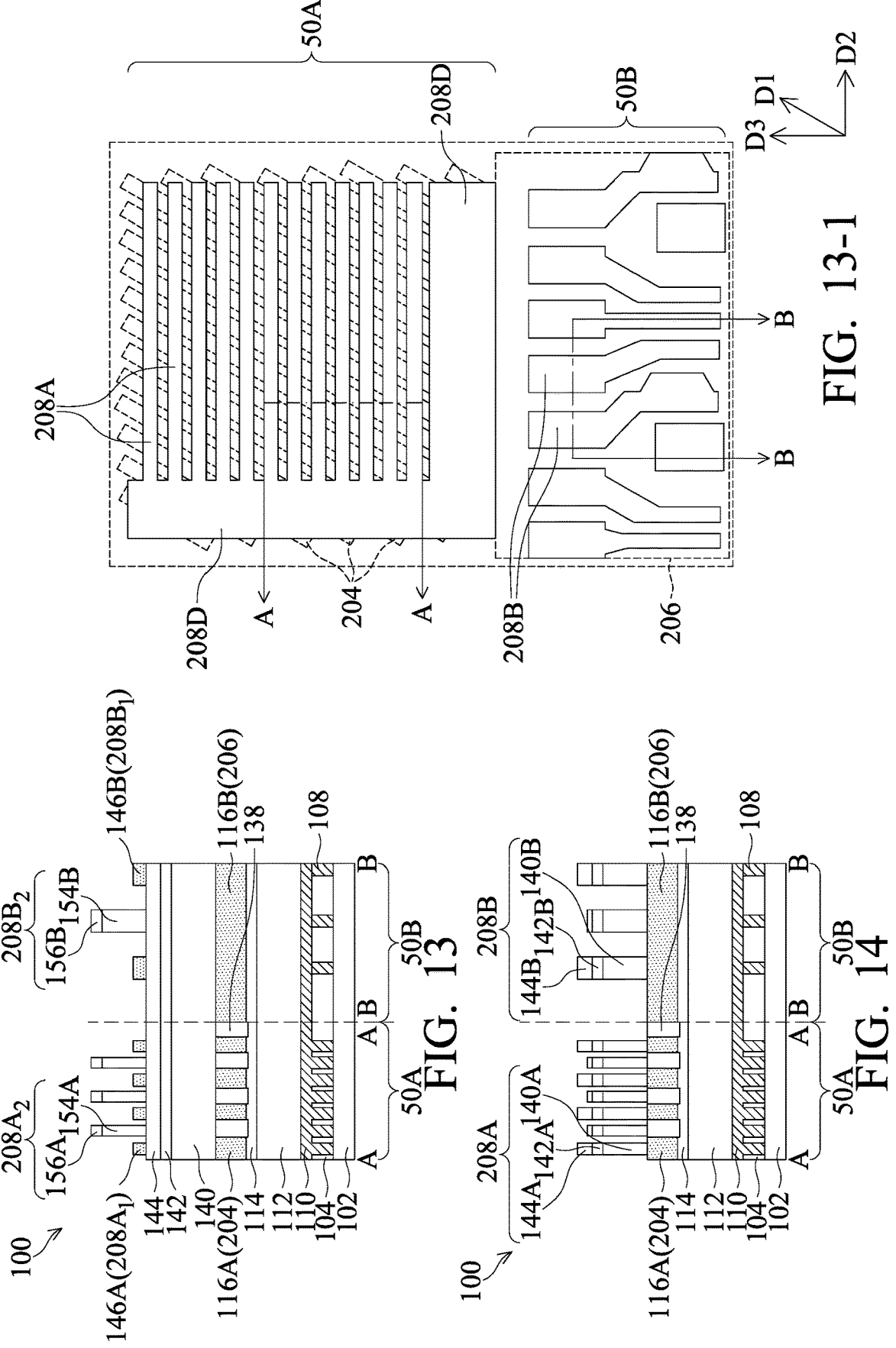

Referring to FIGS. 13 and 13-1, an etching process is performed on the semiconductor memory structure 100 using the patterned photoresist layer 158 to sequentially etch away the portions of the hard mask layer 156 and 154 uncovered by the patterned photoresist layer 158. The patterned photoresist layer 158 may be entirely consumed in the etching process, or removed by an additional process. The etching process transfers the strip patterns 158A and the dummy patterns 158D of the patterned photoresist layer 158 into the hard mask layers 156 and 154 to form patterned hard mask layers 156A and 154A. The patterned hard mask layers 156A and 154A have strip patterns $208A_2$ and the dummy patterns 208D. The wire patterns 158B are transferred into the hard mask layers 156 and 154 to form patterned hard mask layers 156B and 154B. The patterned hard mask layers 154B and 154B combine to form wire patterns $208B_2$.

The strip patterns 208A (including $208A_1$ and $208A_2$) in the memory cell array region 50A and the wire patterns 208B (including $208B_1$ and $208B_2$) in the periphery circuitry region 50B are formed by two photolithography processes, which may increase the density of patterns, and thus facilitate the scaling down of the semiconductor memory device.

Referring to FIG. 14, an etching process is performed on the semiconductor memory structure 100 to transfer the strip patterns 208A in the memory cell array region 50A into the hard mask layers 144, 142 and 140 to form patterned hard mask layers 144A, 142A and 140A and transfer the wire patterns 208B in the periphery circuitry region 50B into the hard mask layers 144, 142 and 140 to form patterned hard mask layers 144B, 142B and 140B. Although not shown, the dummy patterns 208D are also transferred into the hard mask layers 144, 142 and 140. The patterned hard mask layers 156A, 156B, 154A, 154B, 146A, and 146B may be entirely consumed in the etching process, or they may be removed by an additional process.

Referring to FIGS. 15 and 15-1, an etching process is performed on the semiconductor memory structure 100 using the strip patterns 208A, the dummy patterns 208D and the wire patterns 208B to etch away the portions of the patterned hard mask layers 116A and 116B and fill layer 138 uncovered by the strip patterns 208A, the dummy patterns 208D and the wire patterns 208B. The patterned hard mask layers 144A, 144B, 142A, and 142B may be entirely consumed in the etching process, or removed by an additional process.

The remaining portion of the patterned hard mask layer 116A after the etching process is denoted as 116C. In the center portion of the memory cell array region 50A, the strip patterns 204 are patterned into pad patterns 210. At the edge of the memory cell array region 50A, the strip patterns 204 are patterned into dummy pad patterns 210D. The remaining portion of the fill layer 138 after the etching process is denoted as 138A. For brevity and clarity, the fill layer 138A is not shown in FIG. 15-1. In the periphery circuitry region 50B, the etching process transfers the wire patterns 208B into the patterned hard mask layer 116B. The remaining portion of the patterned hard mask layer 116B is denoted as 116D.

In accordance with some embodiments of the present disclosure, the hard mask layer 116 is formed by two patterning processes. In specific, the hard mask layer 116 is patterned for the first time (by the first and the second photolithography processes) to form the strip patterns 204, and then the strip patterns 204 are patterned for the second time (by the third and the fourth photolithography processes) to form the pad patterns 210. In some case that the hard mask layer 116 is first patterned by the third and the fourth photolithography processes to form the strip patterns 208 and then the strip patterns 208 are patterned by the first and the second photolithography processes to form the pad patterns 210, the etching amount in the memory cell array region 50A cannot be enhanced as described above in FIG. 8 as a high etching amount may cause the pad patterns in the memory cell array region to be deformed by excessive etching. Therefore, the sequence of the process steps disclosed in the embodiments of the present disclosure may relax the window of the etching processes for forming the pad patterns 210.

Referring to FIG. 16, an etching process is performed on the semiconductor memory structure 100 to transfer the pad patterns 210 and the dummy pad patterns 210D in the memory cell array region 50A into the hard mask layers 114 and 112 to form patterned hard mask layers 114A and 112A and to transfer the wire patterns 208B in the periphery circuitry region 50B into the hard mask layers 114 and 112 to form patterned hard mask layers 114B and 112B. The patterned hard mask layers 140A and 140B may be entirely consumed in the etching process, or removed by an additional process. In addition, because the material (e.g., SiO) of the fill layer 138 has a greater etching selectivity with respect to the material (e.g., silicon-rich SiON), the fill layer 138 may be removed during the etching process.

Referring to FIGS. 17 and 17-1, an etching process is performed on the semiconductor memory structure 100 to transfer the pad patterns 210 and the dummy pad patterns 210D in the memory cell array region 50A into the conductive material 110 to form conductive pads 161 and dummy conductive pads 162D, and to transfer the wire patterns 208B in the periphery circuitry region 50B into the conductive material 110 to form wires 164. The patterned hard mask layers 116A, 116B and 116C may be entirely consumed in the etching process, or removed by an additional process.

Afterward, the patterned hard mask layers 112A and 112B may be removed by an etching process or an ashing process, thereby exposing the conductive pads 162, the dummy conductive pads 162D and the wires 164. In some embodiments, capacitor structures are formed over the conductive pads 162. The capacitor structures may include bottom electrode layers in contact with the conductive pads 162, capacitor dielectric layers over the bottom electrode layers, and top electrode layers over the capacitor dielectric layers. The bottom electrode layers are electrically coupled to the source/drain regions in the active regions through the conductive pads 162 and the contact plug 160.

In accordance with the embodiments of the present disclosure, by using the immersion coating technique three times and the MUV Mask technique one time, the pad patterns 210 in the memory cell array region 50A and the wire patterns 208B in the periphery circuitry region 50B are formed at the same time. Therefore, the embodiments of the present disclosure omit one photolithography process (e.g., an immersion coating) as compared with the case where the pad patterns in the memory cell array region and the wire patterns in the peripheral circuitry region are formed separately. As a result, the manufacturing cost of the semiconductor memory structure can be saved, and the process difficulty of the semiconductor memory structure may reduce.

As described above, the embodiments of the present disclosure provide a method for forming a semiconductor memory structure that can significantly reduce the risk of the patterns in the memory cell array region being transferred into the periphery circuitry region 50B. This can prevent pattern failure of the wire patterns in the periphery circuitry region adjacent to the boundary between the memory cell array region and the periphery circuitry region. This can increase the manufacturing yield of the semiconductor memory device.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a semiconductor memory structure, comprising:

forming a conductive material over a dielectric structure;

forming a first patterned hard mask layer over the conductive material, wherein the first patterned hard mask layer comprises first strip patterns and a mesa pattern connected to the first strip patterns;

forming a second patterned hard mask layer over the first patterned hard mask layer, wherein the second patterned hard mask layer comprises second strip patterns overlapping the first strip patterns and first wire patterns overlapping the mesa pattern;

etching the first patterned hard mask layer using the second patterned hard mask layer, wherein the second strip patterns and the first wire patterns are simultaneously used as masks to respectively etch the first strip patterns and the mesa pattern, and remaining portions of the first strip patterns form pad patterns, and remaining portions of the mesa pattern form second wire patterns; and transferring the pad patterns and the second wire patterns into the conductive material.

2. The method for forming the semiconductor memory structure as claimed in claim 1, wherein the first strip patterns extend in a first direction, and the second strip patterns extend in a second direction that is not parallel to the first direction.

3. The method for forming the semiconductor memory structure as claimed in claim 1, further comprising, before forming the second patterned hard mask layer over the first patterned hard mask layer:

forming a fill layer over the first strip patterns and between the first strip patterns; and removing a portion of the fill layer over the first strip patterns.

4. The method for forming the semiconductor memory structure as claimed in claim 3, further comprising:

etching the fill layer using the second patterned hard mask layer while etching the first patterned hard mask layer using the second patterned hard mask layer; and entirely removing the fill layer before transferring the pad patterns into the conductive material.

5. The method for forming the semiconductor memory structure as claimed in claim 1, further comprising, before forming the first patterned hard mask layer:

forming a hard mask layer over the dielectric structure;

forming third strip patterns over the hard mask layer;

forming a photoresist pattern covering a first part of the third strip patterns while exposing a second part of the third strip patterns; and etching the hard mask layer using the third strip patterns and the photoresist pattern, wherein the exposed second part of the third strip patterns is transferred into the hard mask layer to form the first strip patterns, and the photoresist pattern is transferred into the hard mask layer to form to the mesa pattern.

6. The method for forming the semiconductor memory structure as claimed in claim 5, wherein the third strip patterns continuously extend in a memory cell array region and a periphery circuitry region of the semiconductor memory structure.

7. The method for forming the semiconductor memory structure as claimed in claim 1, wherein the dielectric structure has openings, and the conductive material is formed in the openings to form contact plugs.

8. The method for forming the semiconductor memory structure as claimed in claim 1, wherein the pad patterns are transferred into the conductive material to form conductive pads, and each of the conductive pads corresponds to each of the contact plugs.

9. The method for forming the semiconductor memory structure as claimed in claim 8, further comprising:

removing the pad patterns; and forming capacitor structures over the conductive pads.

10. The method for forming the semiconductor memory structure as claimed in claim 1, wherein the second patterned hard mask layer further comprises fourth strip patterns, wherein the fourth strip patterns and the second strip patterns are arranged alternately.

11. The method for forming the semiconductor memory structure as claimed in claim 10, wherein forming the second strip patterns of the second patterned hard mask layer comprises performing a first photolithography process, and forming the fourth strip patterns of the second patterned hard mask layer comprises performing a second photolithography process after performing the first photolithography process.

12. A method for forming a semiconductor memory structure, comprising:

forming a conductive material over a dielectric structure;

forming a first patterned hard mask layer over the conductive material, wherein the first patterned hard mask layer comprises first strip patterns and a mesa pattern connected to the first strip patterns;

forming a second patterned hard mask layer over the first patterned hard mask layer, wherein the second patterned hard mask layer comprises second strip patterns overlapping the first strip patterns and first wire patterns overlapping the mesa pattern;

etching the first patterned hard mask layer using the second patterned hard mask layer, wherein remaining portions of the first strip patterns form pad patterns, and remaining portions of the mesa pattern form second wire patterns; and transferring the pad patterns and the second wire patterns into the conductive material, wherein the dielectric structure has openings, and the conductive material is formed in the openings to form contact plugs.

13. The method for forming the semiconductor memory structure as claimed in claim 12, wherein the first strip patterns extend in a first direction, and the second strip patterns extend in a second direction that is not parallel to the first direction.

14. The method for forming the semiconductor memory structure as claimed in claim 12, further comprising, before forming the second patterned hard mask layer over the first patterned hard mask layer:

forming a fill layer over the first strip patterns and between the first strip patterns; and removing a portion of the fill layer over the first strip patterns.

15. The method for forming the semiconductor memory structure as claimed in claim 14, further comprising:

etching the fill layer using the second patterned hard mask layer while etching the first patterned hard mask layer using the second patterned hard mask layer; and entirely removing the fill layer before transferring the pad patterns into the conductive material.

16. The method for forming the semiconductor memory structure as claimed in claim 12, further comprising, before forming the first patterned hard mask layer:

forming a hard mask layer over the dielectric structure;

forming third strip patterns over the hard mask layer;

forming a photoresist pattern covering a first part of the third strip patterns while exposing a second part of the third strip patterns; and etching the hard mask layer using the third strip patterns and the photoresist pattern, wherein the exposed second part of the third strip patterns is transferred into the hard mask layer to form the first strip patterns, and the photoresist pattern is transferred into the hard mask layer to form to the mesa pattern.

17. The method for forming the semiconductor memory structure as claimed in claim 16, wherein the third strip patterns continuously extend in a memory cell array region and a periphery circuitry region of the semiconductor memory structure.

18. The method for forming the semiconductor memory structure as claimed in claim 12, wherein the pad patterns are transferred into the conductive material to form conductive pads, and each of the conductive pads corresponds to each of the contact plugs.

19. The method for forming the semiconductor memory structure as claimed in claim 18, further comprising:

removing the pad patterns; and forming capacitor structures over the conductive pads.

20. The method for forming the semiconductor memory structure as claimed in claim 12, wherein the second patterned hard mask layer further comprises fourth strip patterns, wherein the fourth strip patterns and the second strip patterns are arranged alternately.

\* \* \* \* \*